United States Patent
Jurczak et al.

(10) Patent No.: US 6,855,605 B2
(45) Date of Patent: Feb. 15, 2005

(54) SEMICONDUCTOR DEVICE WITH SELECTABLE GATE THICKNESS AND METHOD OF MANUFACTURING SUCH DEVICES

(75) Inventors: Malgorzata Jurczak, Leuven (BE); Rita Rooyackers, Leuven (BE); Emmanuel Augendre, Leuven (BE); Goncal Badenes, Sabadell (ES)

(73) Assignee: Interuniversitair Microelektronica Centrum (IMEC), Leuven (BE)

(*) Notice: Subject to any disclaimer, the term of this patent is extended or adjusted under 35 U.S.C. 154(b) by 156 days.

(21) Appl. No.: 10/286,427

(22) Filed: Oct. 30, 2002

(65) Prior Publication Data

US 2003/0099766 A1 May 29, 2003

(30) Foreign Application Priority Data

Nov. 26, 2001 (EP) .............................. 01204564

(51) Int. Cl.$^7$ ................. H01L 21/8234; H01L 21/3205; H01L 21/425; H01L 29/76; H01L 31/062
(52) U.S. Cl. ................. 438/275; 438/197; 438/532; 438/585; 438/588; 257/412; 257/E21.638; 257/E21.632; 257/E21.316
(58) Field of Search .................. 438/257, 197, 438/532, 585, 588; 257/412, 371, 369, E21.638, E21.632, E21.316, E21.285, E21.197

(56) References Cited

U.S. PATENT DOCUMENTS

| | | | | |
|---|---|---|---|---|
| 4,057,895 A | | 11/1977 | Ghezzo | |
| 5,021,354 A | * | 6/1991 | Pfiester | 438/230 |
| 5,963,803 A | * | 10/1999 | Dawson et al. | 438/231 |
| 6,033,944 A | * | 3/2000 | Shida | 438/199 |
| 6,080,629 A | * | 6/2000 | Gardner et al. | 438/301 |
| 6,166,413 A | * | 12/2000 | Ono | 257/369 |
| 6,171,897 B1 | * | 1/2001 | Takenaka | 438/232 |
| 6,294,460 B1 | | 9/2001 | Subramanian et al. | |
| 6,348,405 B1 | | 2/2002 | Ohuchi | |

FOREIGN PATENT DOCUMENTS

| | | |
|---|---|---|
| GB | 2 346 261 A1 | 8/2000 |
| JP | 2000058668 | 2/2000 |

OTHER PUBLICATIONS

European Search Report for European Application No. EP 01204564.7, filed Nov. 26, 2001.

* cited by examiner

Primary Examiner—John F. Niebling
Assistant Examiner—Ron Pompey
(74) Attorney, Agent, or Firm—Knobbe, Martens, Olson & Bear LLP.

(57) ABSTRACT

A method of forming layers, in the same device material, with different thickness or layer height in a semiconductor device comprises forming device material layer or gate electrode layer disposable parts in selected regions of the device layer. The disposable parts can be formed by doping the selected regions to the desired depth d. The as-deposited thickness t of this device layer can be adjusted or modulated after the patterning of the individual devices by removing the disposable parts.

22 Claims, 6 Drawing Sheets

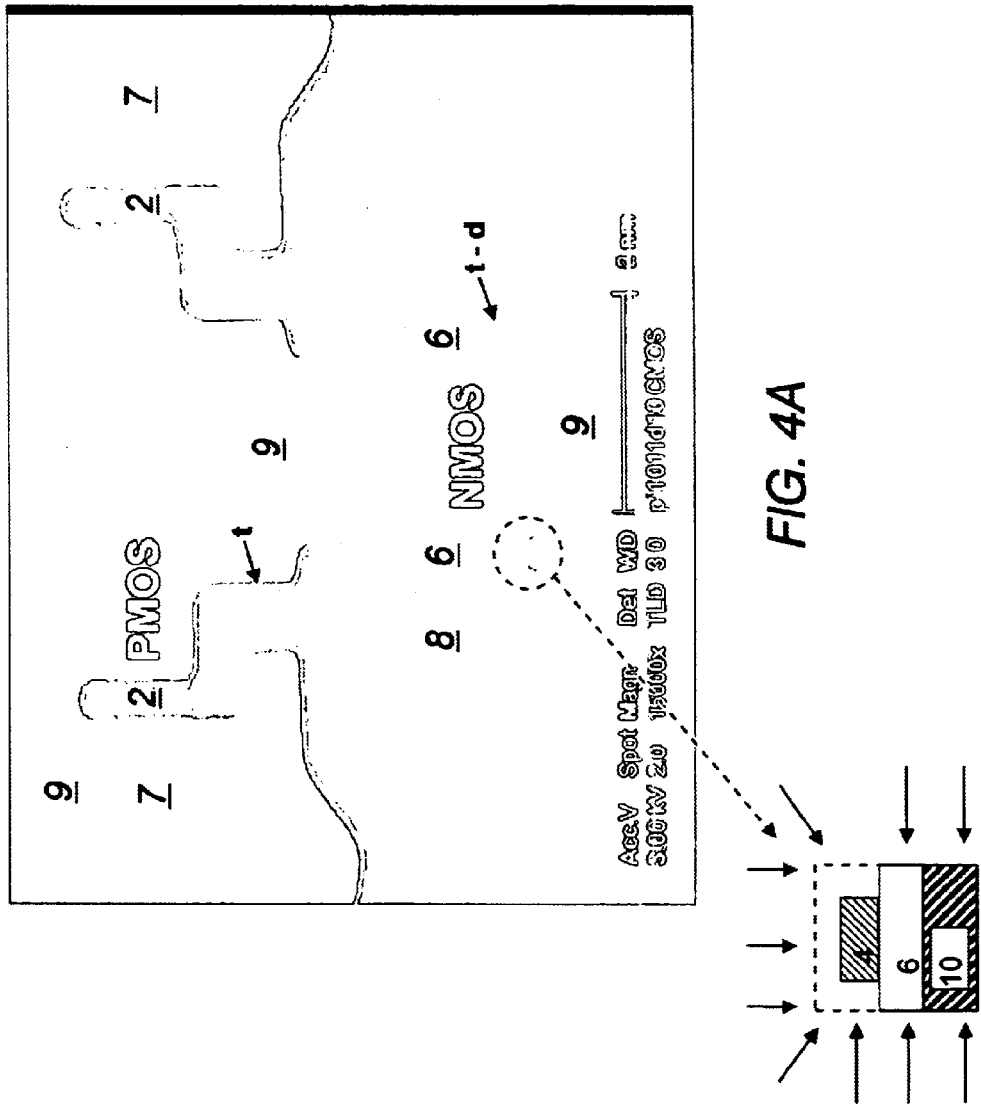

SEMICONDUCTOR DEVICE WITH SELECTABLE GATE THICKNESS AND METHOD OF MANUFACTURING SUCH DEVICES

BACKGROUND OF THE INVENTION

1. Field of the Invention

The invention pertains to the field of semiconductor manufacturing processes. More particularly, the invention pertains to a method of manufacturing a semiconductor device with structural elements having varying thicknesses in a common layer.

2. Description of the Related Technology

Complementary Metal-Oxide Semiconductor (CMOS) integrated circuits combine both n-type (nMOS) and p-type (pMOS) field effect transistors (FET). These two types of transistors are also commonly referred to as n-channel, or nMOS, and p-channel, or pMOS, devices, respectively. Methods of fabricating CMOS integrated circuits are well known in the technology. Areas are selected on a semiconductor substrate, such as silicon, where transistors will be formed during subsequent processing. These so-called "active areas" are insulated from each other by forming insulation structures between the areas. Examples of such insulation structures are locally oxidized silicon (LOCOS) or shallow trenches filled with dielectrics (STI). Active areas where nMOS or pMOS devices are to be formed can be labeled respectively as nMOS or pMOS active areas.

A gate dielectric is formed on the surface of the semiconductor substrate, where the gate dielectric is typically formed by oxidizing the silicon surface or by forming a stack comprising high-k dielectrics on the substrate. A gate electrode is formed on top of this gate dielectric. Typically the gate electrode is formed by deposition of a semiconducting material such as polysilicon (pSi) or polysilicongermanium (pSiGe) or alloys thereof. This layered gate dielectric and electrode material is then patterned to yield the gate stack of the individual transistors.

The semiconductive gate electrode material is rendered conductive by doping it with dopants normally provided by an ion implantation source. Although the gate electrode material is common to both nMOS and pMOS devices, the doping of the gate electrode of both devices is performed separately by selectively masking regions comprising only one of both device types. During the doping of the gate electrode of the nMOS transistor, the source/drain junctions of the nMOS may also be formed, and, mutatis mutandis, during the doping of the pMOS transistor, the corresponding source/drain junctions may be formed in the non-masked active areas. The source/drain junctions serve as electrical contacts to the oppositely doped channel region, formed underneath the gate stack. Additional implantations can be performed over the course of processing, e.g. to form doped regions in the substrate such as a well or sink, or other implantations known to a person skilled in the art to obtain the desired electrical and functional behavior of the device to be processed can be performed.

Doping of the gate electrode generally has to meet several requirements. The ion implant dose (ions/cm$^2$), used to simultaneously dope the gate electrode and the junction regions, must, for example, be high enough to obtain a sufficiently low resistivity in both the gate electrode and the source/drain junctions. The doping should ideally be uniform over the gate electrode, or at least to the interface with the underlying gate electrode. In the event the doping concentration (ions/cm$^3$) at the gate dielectric/gate electrode interface is too low, this part of the gate electrode can be depleted if the field effect transistor is biased into inversion. Such unwanted depletion will have a negative impact on the electrical performance of the transistor: the depletion layer forms an additional capacitance in series with the gate capacitance and it diminishes the control of the gate voltage over the channel and bulk region leading to more severe short channel effects.

In the event a high implant energy is used to implant the ions into the gate electrode, then a uniformly doped gate electrode layer could be obtained. This implant energy however has to be within certain limits because the doping of the gate electrode must be confined to the gate electrode itself. If the gate dopants were to reach the oppositely doped channel region, the channel can be counterdoped, or at least the effective channel doping is reduced, leading to a change in the threshold voltage and the "short channel"-characteristics of the device. A high implant energy would also result in deep junctions whereas in submicron CMOS-based technologies shallow junctions are preferred because of the decreased short channel effects and junction capacitance. Alternately, if a low implant energy is used followed by thermal processing procedures, the above problems can be avoided, but during these, or other subsequent, thermal processing procedures, the gate dopants might diffuse from the gate electrode through the gate dielectric into the channel region and compensate the channel doping.

Penetration of the channel region during implantation of such heavy ions is unlikely to happen even at elevated implant energies due to the use of ions, such as P, As or Sb, to dope the gate electrode of an nMOS device. As the diffusion speed of these impurities is low, at least in the gate dielectric, the channel region will essentially not be penetrated by these heavy ions during thermal processing procedures following the implantation process. Alternately, the lighter ions, such as B, used to dope the gate electrode of a pMOS device are more likely to penetrate the channel through the thin gate dielectrics used in submicron MOS technologies. If the annealing conditions are optimized for pMOS transistors to avoid extensive boron penetration in the channel region, high gate depletion in an NMOS device might occur as the thermal energy or budget of the CMOS process is not sufficient to activate the n-type dopants or have them diffuse all over the gate electrode. The integration of both devices therefore requires careful optimization of implantation conditions and final annealing procedures.

Japanese patent application JP2000058668, which is hereby incorporated by reference, proposes a CMOS architecture where the polysilicon gate electrode has two thicknesses. The thinner nMOS gate electrode requires less diffusion of the n-type dopants, and hence less thermal energy is required to obtain a uniform doping of this gate electrode. The thicker pMOS gate electrode offers enough stopping capability to the implanted ions to prevent penetration of the channel. The thicker pMOS gate electrode enables an increase of the temperature of final RTA and thus improves the dopant activation without the risk of boron penetration. For a given thermal budget, the p-type impurities must diffuse a larger distance before they reach the gate electrode/gate dielectric interface or even the channel region. This so-called "dual gate" CMOS process facilitates the optimization of the process of the gate electrodes with respect to reduction of gate depletion in nMOS and boron penetration in the channel for the pMOS devices. The application describes several embodiments of methods of decreasing the thickness of the gate electrode for the nMOS devices or increasing the thickness of this gate electrode layer for the pMOS devices. These methods can be generalized as follows:

1. Mask the as-deposited polysilicon layer outside the regions of the nMOS devices, remove the polysilicon layer in these unmasked regions using a timed etching, e.g. a dry etching technique such as Reactive Ion Etching (RIE) during a predetermined period of time;
2. Deposit a multilayer structure of polysilicon/silicon oxide/polysilicon as gate electrode on the gate dielectric and remove the top polysilicon layer of this multilayer only in the regions where the nMOS devices will be formed;
3. Mask the as-deposited polysilicon gate electrode layer outside the region of the pMOS devices by a thin oxide layer and grow an additional silicon layer on the top of the non-oxidized regions of the as-deposited polysilicon layer;
4. Mask the as-deposited polysilicon gate electrode layer in the area of the pMOS devices by a thin nitride layer, oxide the non-masked polysilicon layer and remove the oxidized polysilicon layer by a wet etch process.

The proposed method has several disadvantages with respect to process complexity and manufacturing capability. Additional topography is created between the nMOS and pMOS devices as the variation in thickness of the as-deposited polysilicon electrode is obtained prior to the patterning of this polysilicon layer. This difference in height influences the process latitude and control of the patterning process. During the process of etching the polysilicon layer, the gate stack of the nMOS device might be overetched resulting in attacking the underlying active area. This problem of "pitting" might be of more concern in a case where the electrode etching has to stop on thin gate dielectrics. The proposed sequences are therefore not suitable for use in scaled down CMOS processes.

If a dry etch technique is used to thin the as-deposited polysilicon layer in the nMOS regions, the underlying gate oxide is exposed to this etching plasma and plasma damage of the gate dielectric might occur. Timed etch processes typically result in high dispersion of the final thickness as no control over the etching parameters, such as etch speed, is performed. Thickening the as-deposited polysilicon layer in the region of the pMOS devices certainly adds to process complexity as masking steps have to be used as well as processes capable of selective growth. Selective growth or selective etching requires the presence of a masking or stopping layer. If this masking or stopping layer is not removed it will influence the electrical performance of the gate electrode and hence of the corresponding device.

Therefore, improved production and manufacturing methods of forming structural elements of various thicknesses within a common layer of a semiconductor device would be beneficial in the technology.

SUMMARY OF CERTAIN INVENTIVE EMBODIMENTS

In one aspect of the invention a method of forming a structure in a device layer of an electronic component comprises forming a device layer on a substrate, forming at least one disposable part in a selected region of the device layer, wherein the disposable part comprises a material that is substantially the same as the device layer and within the thickness of the device layer, patterning the device layer in the selected region, and selectively removing the at least one disposable part from the device layer.

In an additional aspect of the inventive method, forming at least one disposable part in the selected region of the device layer comprises altering the removal properties of the device layer to a predefined depth within the device layer.

In another aspect of the inventive method, changing the removal properties of the device layer comprises doping the selected region of the device layer to a predefined depth. Doping the selected region of the device layer may comprise ion implantation.

In another aspect of the invention, the method further comprises establishing an antireflective layer on the device layer prior to patterning the device layer. The antireflective layer may comprise at least one of Si, O and N.

In another aspect of the inventive method, selectively removing the at least one disposable part of the device layer further comprises removing the patterned antireflective layer.

Another aspect of the invention is an integrated circuit, comprising a device layer having at least a first and second region, wherein the first region has a different thickness than that of the second region, wherein the difference in thickness between the first and second regions is produced from formation of a disposable part in the device layer and removal of the disposable part to form the first and second regions after the device has been patterned.

The device layer can be a gate electrode layer, and the device layer may comprise a semiconductor material, wherein the semiconductor material may comprise silicon.

In another aspect of the invention a method of manufacturing a semiconductor device having a device layer with a varying thickness comprises outlining at least one selected region of the device layer, forming at least one disposable part in the at least one selected region of the device layer, wherein the disposable part is formed to a predefined depth of the device layer, patterning the device layer in at least the selected region, and selectively removing the disposable part from the device layer.

In another aspect of the inventive method, outlining at least one selected region of the device layer and forming at least one disposable part in the at least one selected region is repeated a plurality of times so as to form disposable parts having different thicknesses in different selected regions of the device layer.

In yet another aspect of the inventive method, forming a disposable part in the at least one selected region comprises altering the removal properties of the device layer in the selected region up to a predefined depth of the device layer. In another aspect of the invention, altering the removal properties may comprise doping the selected region of the device layer to a predefined depth.

BRIEF DESCRIPTION OF THE DRAWINGS

FIG. 4A is an SEM image of a CMOS device comprising n-type and p-type active areas as formed according to one embodiment of the invention.

FIG. 4B is an exemplary cross sectional illustration of a semiconductor device as formed according to one embodiment of the invention and corresponding to an area of the CMOS device of FIG. 4A as indicated.

DETAILED DESCRIPTION OF CERTAIN INVENTIVE EMBODIMENTS

The following detailed description is directed to certain specific embodiments of the invention. However, the invention can be embodied in a multitude of different ways as defined and covered by the claims. In this description, reference is made to the drawings wherein like parts are designated with like numerals throughout.

The description of the present invention will mainly be directed to methods of forming disposable layers within the thickness of a device layer. The device layer may be part of an electronic device such as an integrated circuit or a device manufactured by techniques used for electronic component processing, e.g. a MEMS device.

In semiconductor processing it is often desirable to have devices available with different thickness or layer height. As discussed above, forming nMOS and pMOS devices with different gate electrode thicknesses can be of assistance in, for example, suppressing short channel effects. Also, resistors or capacitors with different electrode thickness can be formed, resulting in different electrical characteristics, e.g. as the resistance of such device, or in processing characteristics, e.g. topographical variations. Preferably, these devices are formed within a common layer of device material, as this would save on production costs. As only one layer of such device material has to be formed on the substrate to yield devices with different thickness, the process throughput can be improved.

After forming a device layer, the thickness of the device layer can be adjusted or modulated to yield devices or parts thereof with different heights to meet the different device or process requirements. A device layer is a stack of at least one layer formed on a substrate, which may be a semiconductor substrate, and of which at least parts thereof remain present in the finished device. The device layer can also be referred to as a permanent layer. A device material is a material that constitutes elements or parts of the finished device.

Figure 1A:
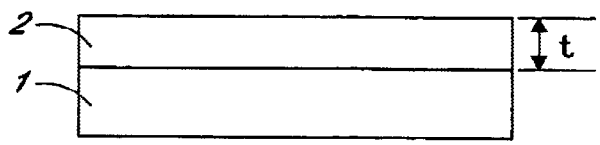
FIG. 1A is an exemplary cross sectional illustration of a device layer and substrate of in an initial step of one embodiment of a method of manufacturing a semiconductor device.

One embodiment of a method of forming a device layer with different thicknesses is illustrated in FIGS. 1A–F. A device layer 2, with an as-deposited thickness t is formed on a substrate 1, as shown in FIG. 1A. This substrate 1 can be at least a part of a partly processed or a pristine wafer or slice of a semiconductor material, such as Si, GaAs, Ge, SiGe, or an insulating material, such as a glass slice, ceramic materials, sapphire, or a conductive material, such as metal. The substrate can have a flat surface area or can already have topography, however this topography is not shown in FIGS. 1A–1F. In the case where a silicon wafer is used in CMOS processing, topography can result from the formation of active areas where the silicon surface is exposed and field regions where an insulating layer such as silicon dioxide layer is formed. The device layer 2 can be of any material, used in semiconductor processing: insulating material such as oxides or nitrides, semiconducting material such as Si, SiGe, GaAs, Ge or a conductive material such as a metal, e.g. Ti, W. The device layer 2 can be formed by chemical vapor deposition (CVD) techniques, spin-coating or other techniques applicable in the state-of-the art. Alternatively, the device layer 2 can be a stack of layers, e.g. Si formed on SiGe.

In a plurality of selected regions 3, disposable (removable or sacrificial) parts, partitions, or members 4 are formed in the device layer 2. Regions can be selected by applying, for example, photolithography processes know in the art whereby a photosensitive resin or resist 5 is spun on the substrate 1. This photosensitive resin can be selectively exposed to a form of radiation outlining the selected regions. After subsequently developing the exposed regions 3 of the photosensitive resin, the patterned photosensitive resin will cover the underlying layers in those areas where the resin remained. Locations 3 from which the resist is removed and hence become unmasked, can be subjected to a variety of subtractive, e.g. dry or wet etching, or additive, e.g. ion implanting, processes.

Figure 1B:
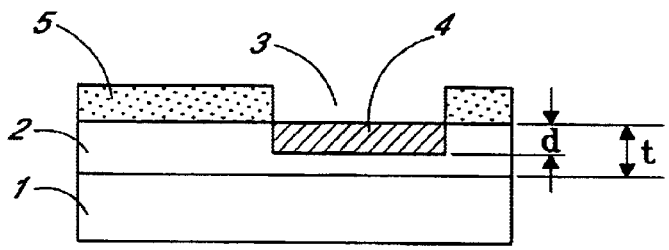
FIG. 1B is an exemplary cross sectional illustration of the device layer and substrate of FIG. 1a, wherein a resist layer has been applied and a disposable part has been formed in the device layer in an intermediary step of one embodiment of a method of manufacturing a semiconductor device.
Figure 1C:
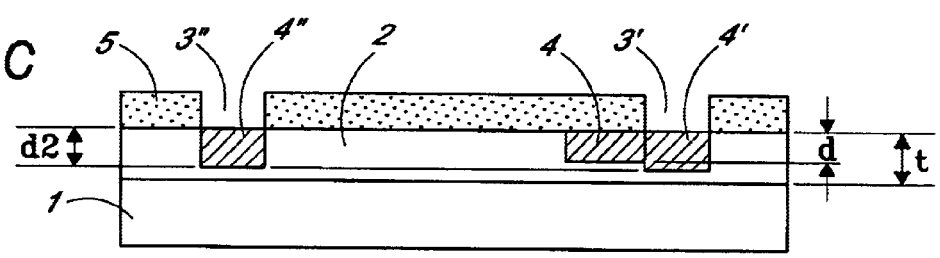
FIG. 1C is an exemplary cross sectional illustration of the device layer, substrate, resist layer, and disposable part of FIG. 1b, wherein additional disposable parts have been formed in the device layer in an intermediary step of one embodiment of a method of manufacturing a semiconductor device.

A disposable part 4 can be formed in the device layer 2 by making the device layer 2 disposable, at least up to a predetermined depth d, in the selected regions 3, i.e. the unmasked regions 3 as shown in FIG. 1B. Disposable parts are formed by exposing the device layer 2 within the selected regions 3 to an external environment or species capable of differentiating the material properties, more specifically the removal, degradation, or erosion properties of the device layer 2 within selected regions 3 from the material properties of this device layer 2 in the non-selected regions or in the unaffected parts of the selected regions. Thus, by locally changing the removal properties of the device layer 2 up to a predetermined depth d, a disposable part of the device layer can be formed. This alteration of the material properties need not essentially affect the as-deposited thickness t of the device layer.

This sequence of selecting regions and forming disposable parts in the device layer 2 at the selected regions 3 can be repeated as many times as desired. In each such sequence, different regions and/or different predetermined depths d can be selected, thereby allowing the height of the disposable parts formed in the device layer to vary from one selected region to another, as shown in FIG. 1". The initial depth of the disposable part 4 formed in region 3 as selected in FIG. 1B is locally increased in the newly selected region 3' from a value d to a value d2 (see part 4' of FIG. 1C), while in another newly selected region 3", a disposable part 4" with the same depth d2 is created.

Figure 1D:
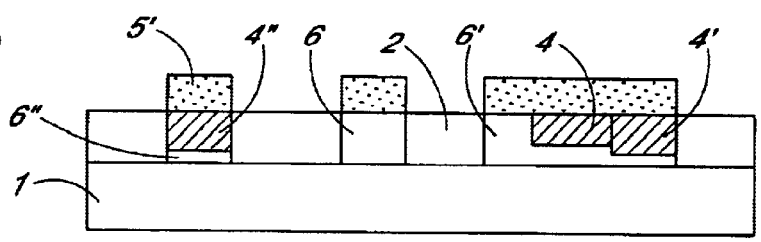
FIG. 1D is an exemplary cross sectional illustration of the device layer, substrate, resist layer, and disposable parts of FIG. 1C.
Figure 1E:
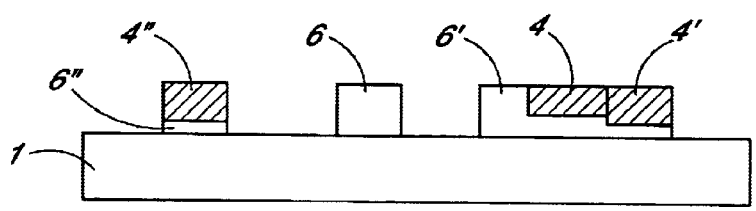
FIG. 1E is an exemplary cross sectional illustration of the device layer, substrate, and disposable parts of FIG. 1D.
Figure 1F:
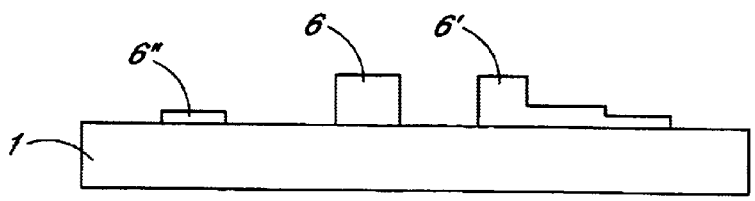
FIG. 1F is an exemplary cross sectional illustration of the device layer and substrate of FIG. 1E.

After forming the disposable members 4, the device layer 2 is patterned as illustrated in FIGS. 1D–F. Using standard processing, two-dimensional devices or geometrical features are established in the device layer both in the selected regions 3 as in the non-selected regions. Whereas in a previous step the height profile of the final devices is predetermined by varying the removal properties of the device layer, this patterning step defines the layout of the devices. The formation of such two-dimensional devices can be done, e.g. by patterning steps know in the art. Such a patterning step can comprise the step of transferring, by means of a photolithography process, the desired pattern from a photomask to a resist layer 5" covering the device layer as shown in FIG. 1D. The resist layer 5' covers parts of the disposable elements 4', 4" or parts of the device layer 2 that doesn't contain disposable elements. The thus formed resist pattern is then transferred to the underlying device layer by a variety of subtractive processes.

The patterning process can also comprise removing or stripping the protective resist pattern, yielding a variety of two-dimensional devices or geometrical features formed within the same layer, wherein the two-dimensional devices comprise disposable parts 4, and the disposable parts have the same or different thickness as shown in FIG. 1F. FIGS. 1D through 1F illustrate the case wherein three devices are formed within the device layer 2. The left most device of FIG. 1E is patterned within the perimeter of the corresponding selected region 3', creating a stack partitioned into the disposable element 4" and a non-disposable element. The device in the middle is patterned outside any selected region 3 and doesn't comprise any disposable or sacrificial part. The thickness of this genuine device is the thickness of the device layer 2. The device on the right has three partitions as it overlaps partly two selected regions 3, 3' and one non-selected region. The device on the right thus contains a disposable part 4' on the left with thickness d, a disposable part in the middle 4B with thickness d2 and a non-disposable part 6' having the thickness t of the device layer. As at this stage of processing which deals with the geometrical patterning of the device layer, the as-deposited thickness t of this device layer is substantially maintained, the patterning process can be very well controlled and will not suffer e.g. from focusing problems or difference in height of the layer to be etched.

After the patterning of the device layer 2 the disposable parts 4, 4', and 4" of the patterned device layer are removed, selectively with respect to the substrate 1 and to the non-disposable parts 6 of the patterned device layer, yielding a variety of devices formed within the same device layer as shown in FIG. 1f. The difference in material properties, e.g. removability or solubility, previously introduced in the device layer is thus exploited to remove the disposable parts 4 of the patterned device layer at least selective to the other parts 6 of this device layer. This removal can be done by dry, e.g. reactive ion etching (RIE) or wet etching or by any other suitable removal process. The thickness of the non-removed parts or members of the patterned device layer 2 can vary from one device to another or can vary within one device. The disposable parts can be removed selectively because the removal properties of these disposable parts are enhanced with respect to the other parts of this device layer. Depending on the depth to which these removal properties of the device layer are changed, disposable parts with different heights are or can be formed. The local layer thickness of a device or part thereof will be the as-deposited thickness t of the device layer minus the local predetermined depth d to which the disposable part is formed. During the step of removing the disposable part, the feature size of the device, as defined during the preceding patterning step, is substantially maintained. FIG. 1f shows the patterned devices of FIG. 1e after the disposable elements are removed. The device 6" on the left has a reduced thickness, the device in the middle 6 is not affected by the removal of the disposable elements, while the device 6' on the right has topography.

As that part of the device layer 2 in which the material properties are changed, i.e. the disposable part 4, is removed and hence is no longer present in the resulting devices, the electrical or physical behavior of these devices is not impaired by the process of locally modifying the thickness of the device layer. The properties of the non-disposable parts 6 of the device layer are essentially unaffected in the present method and are substantially identical to the properties of the as-deposited device layer.

One embodiment of the invention comprises a method of forming a dual-thickness gate electrode. A CMOS circuit is formed comprising nMOS and pMOS devices. The nMOS devices preferably have a gate electrode smaller in height than the pMOS devices, and the gate electrode of both devices is typically made of a common material. The dual-thickness gate electrode offers a wide technological window and process margin for optimization of the gate stack in a CMOS process integration flow. The variation in thickness of the material, used to form the gate electrode, is formed after the patterning of the individual gate stacks. This process sequence can simplify the patterning process such that during the lithography process no additional topography is introduced which might require adaptation of the lithographic processing. During the etching process, the risk of damaging the gate dielectric, or other side effects such as pitting or consuming the substrate next to the gate stack, are considerably reduced. The proposed method of gate thinning is a self stopping process due to the selectivity incorporated into the gate electrode material. This selectivity is advantageously only exploited after the patterning process. The process sequence therefore can provide improved uniformity and repeatability than sequences in the prior art.

One embodiment of a method of formation of a gate stack in a CMOS process is illustrated in FIGS. 2A–D. A substrate 1, such as a semiconductor substrate, comprises semiconductor topography as illustrated. A first gate stack comprising an insulator 10 and a conductor 2 is formed on a first region, such as a p-type active area 7. A second gate stack is formed on a second region, such as an n-type active area 8. The first 7 and second regions 8 may be laterally spaced apart by field regions 9, for example.

Figure 2A:
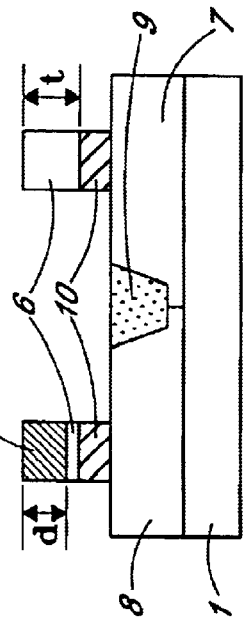
FIG. 2A is an exemplary cross sectional illustration of a semiconductor device at an intermediary stage of forming nMOS and pMOS devices with different gate electrode thickness according to one embodiment of a method of manufacturing a semiconductor device.

In FIG. 2A, both the first and second gate stacks comprise a gate dielectric 10 (insulator) and a gate electrode material 2 (conductor). The gate dielectric 10 can be silicon dioxide, silicon nitride or other dielectrics used in semiconductor processing. The thickness of the gate dielectric layer may vary from approximately 0.1 nm to approximately 50 nm, and preferably from about 1 to about 10 nm. The gate electrode material 2 can be, for example, Si, SiGe in various degrees of crystallinity such as amorphous, polycrystalline, or monocrystalline. The as-deposited thickness t of the gate electrode material 2 can range from approximately 10 nm to approximately 500 nm, and preferably from about 50 nm to about 350 nm. Some active areas 7 will be used to form pMOS devices, while the other active areas 8 will be used to form nMOS devices.

Figure 2B:
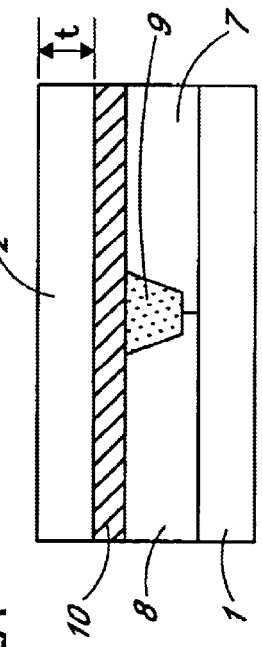
FIG. 2B is an exemplary cross sectional illustration of a semiconductor device at an intermediary stage, following the stage illustrated in FIG. 2A, of forming nMOS and pMOS devices with different gate electrode thickness according to one embodiment of a method of manufacturing a semiconductor device.

Selected regions 3 of the gate electrode material 2, or device layer, are doped to form the disposable parts 4 as shown in FIG. 2B. The regions 3 are selected by a photolithography process using, for example, an nPLUS mask. The pattern of the nPLUS mask defines the regions where later on in the process flow the junction implant of the nMOS devices will be made, while the remaining area of the substrate, including the pMOS active area 7, remains covered with a resist 5. The nPLUS mask is available in a standard CMOS maskset. Other masks, e.g. the p WELL mask, or more dedicated masks may be used depending on the specific configuration of the circuit composed of the individual devices being processed. Preferably, the doping of the selected regions 3 is performed by ion implanting, as indicated by the arrows in FIG. 2B, however, doping from a gaseous environment or solid source can also be performed.

Ion implant doping can advantageously control the doping levels over many orders of magnitude and establish the depth profiles of the implanted species by controlling energy effects and channeling effects. Depending on the implantation energy and the type of species, the implant depth d can be varied. In a case where polysilicon is used as the gate electrode layer 2, implantation species can include P, As, B, Sb, N, O, and Ge, while the implantation energy can range from 100 eV to 200 keV depending on the as-deposited thickness t and the requested remaining thickness of the final gate electrode, which is equal to (t–d). The implant dose can range from approximately 1e14 at/cm2 to 1e20 at/cm2, and preferably from about 1e15at/cm2 to 1e17at/cm2. After the implantation of the device layer 2, a temperature processing step can be performed. This annealing process can be executed in a furnace or in a RTP (Rapid Thermal Processing) chamber, for example.

Figure 2C:
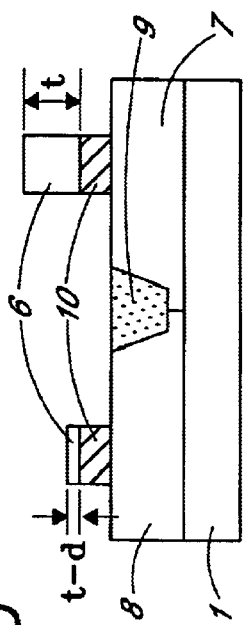
FIG. 2C is an exemplary cross sectional illustration of a semiconductor device at an intermediary stage, following the stage illustrated in FIG. 2B, of forming nMOS and pMOS devices with different gate electrode thickness according to one embodiment of a method of manufacturing a semiconductor device.

The layered gate dielectric 10 and electrode material 2 are then patterned to yield the gate stack of the future individual nMOS transistors in the nMOS active area 8, and pMOS transistors in the pMOS active area 7, as shown in FIG. 2C. For nMOS devices, the gate stack comprises the gate dielectric 10, the as-deposited part 6 of the electrode layer 2, and the doped part or disposable part 4 of the electrode layer. For pMOS devices, the gate stack doesn't comprise a disposable part.

Figure 2D:
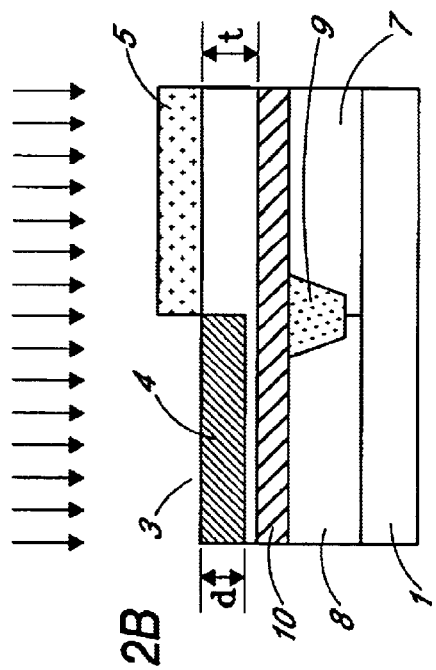
FIG. 2D is an exemplary cross sectional illustration of a semiconductor device at an intermediary stage, following the stage illustrated in FIG. 2C, of forming nMOS and pMOS devices with different gate electrode thickness according to one embodiment of a method of manufacturing a semiconductor device.

The doped portion of the nMOS gate stack is then removed by dry or wet etching, for example, as shown in FIG. 2D. Because all of the nMOS gate stacks are exposed during the same nPLUS masking step to the same doping conditions, the thickness d of the disposable part 4 will essentially be the same for all nMOS devices. The removal of the disposable part 4 is done selectively with respect to the undoped parts 6 of the gate electrode and to the gate dielectric 10 of both the nMOS and pMOS devices, and selectively with respect to the underlying substrate 1. Because the concentration of the dopant in the gate electrode material determines the etch rate during this removal step, the dose and energy of the implant process are used as tuning parameters for the rate of removal.

In "Etch rates for Micromachining Processing" from the Journal of Microelectronical Systems, Vol. 5, No. 4 of December 1996, K. Williams et al. compares the difference in etch rates between blanket undoped and n+ doped polysilicon. In U.S. Pat. No. 3,715,249, Panousis indicates that highly doped polysilicon is unwontedly attacked by phosphoric acid and therefore solutions to prevent such undesired etching by changing the etchant composition are desired.

During removal of the disposable part 4, approximately 50 nm to 200 nm of the gate electrode material 2 is converted in the selected regions 3 and will be consumed during this removal process.

Figure 3:
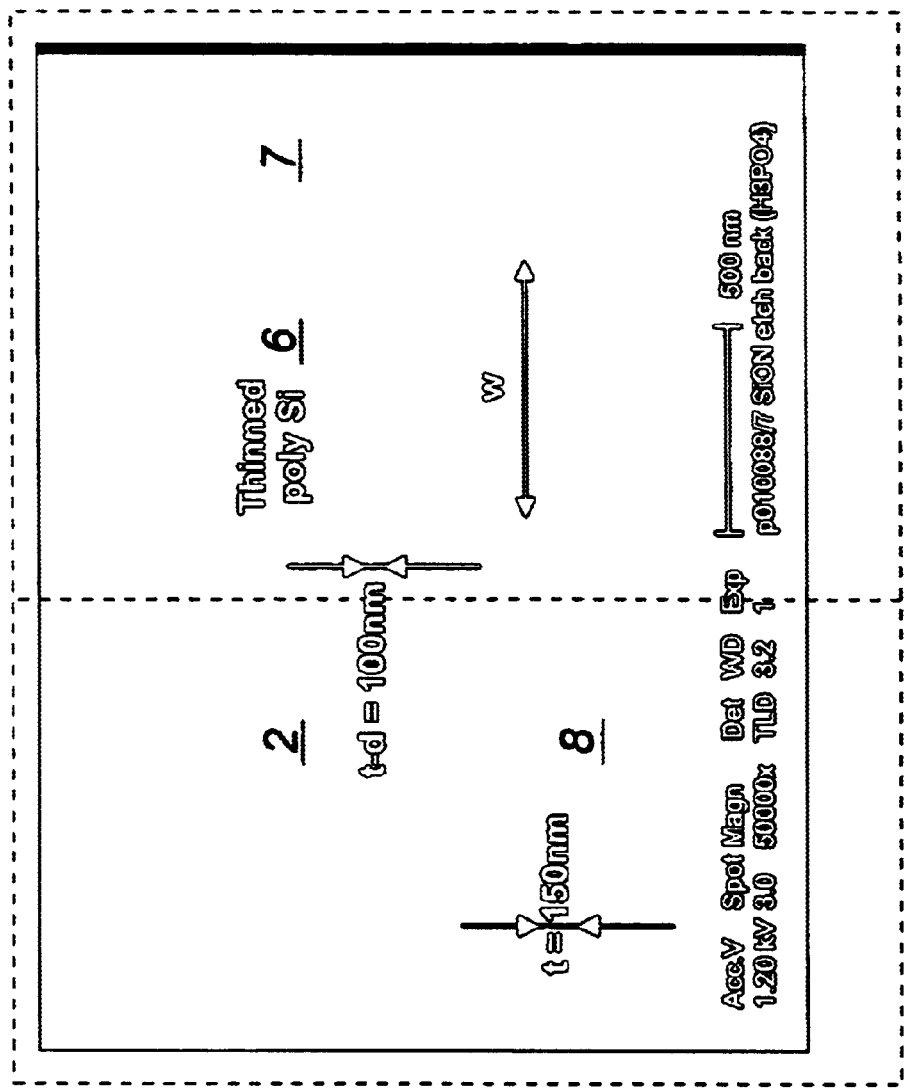
FIG. 3 is a scanning electron microscopy (SEM) image of a semiconductor device illustrating height difference within the electrode layer as formed according to one embodiment of the invention.

FIG. 3 is a scanning electron microscopy (SEM) image of a semiconductor device illustrating height difference within the electrode layer as formed according to one embodiment of the invention. A result of a process of locally thinning the gate electrode layer is illustrated in a case where polysilicon is used as gate electrode material. On top of two areas 7, 8 separated by a center line C, a polysilicon line with corresponding difference in thickness is visible. The as-deposited thickness t in area (2) of 150 nm is reduced in the area 6 on the right to t−d=100 nm. This process of locally thinning the polysilicon line is well controlled as is shown by this top view SEM image. The thickness (t−d) of the thinned polysilicon line is substantially uniform and there is no impact on the line width or feature size (w) of the device. Because the removal of gate material occurs only from the top of the gate electrode and not from the undoped edges, the feature size (w) of the gate stack is preserved.

After removing the disposable part 4 of the gate electrode layer 2, the substrate 1, now comprising nMOS and pMOS devices with different gate electrode thicknesses, can be further processed using a CMOS process flow. The gate electrode of both nMOS and pMOS is still the same electrode material for both device types. Formation of the junctions, spacers and silicide can be performed, and no complications with either spacer formation or the silicide forming process can be expected. The difference in gate stack height, due to different polysilicon levels present, provides an ability to vary the spacer thickness: thinner for a lower gate and thicker for a higher gate. This variation in spacer thickness can be beneficial for a CMOS architecture; a thicker spacer in case of pMOS devices protects the pMOS transistor from extensive lateral diffusion of highly doped boron junctions (HDD) into the channel region underneath the gate stack, and thinner spacers in case of nMOS devices allows reduction in the series resistance as long as lowly doped extensions (LDD) are avoided. The following spacer thickness have been obtained:

nMOS with polysilicon thickness (t−d) of 100 nm: spacer thickness of 45 nm pMOS with polysilicon thickness t of 150 nm: spacer thickness of 85 nm The differences in the spacer thickness in a CMOS circuit with dual thickness polysilicon gate are illustrated in FIG. 4A. Two CMOS devices are shown in FIG. 4A: the pMOS devices are lying in isolated pMOS active areas 8 while the nMOS devices have nMOS active area 7 in common. Within the nMOS active area 7 the polysilicon line is thinned. Again, the thickness uniformity and feature size is substantially controlled. FIG. 4B illustrates the effect of an isotropic process to remove the disposable parts. Although the gate stack comprising the gate dielectric 10, the unaffected part 6 of the gate electrode 2, and the disposable part 4 of the gate electrode 2 are exposed to the removing species (indicated by the arrows) from the top and the side edges of the stack, only the disposable part 4 is being removed as indicated by the change in size of this disposable part 4 from the initial size (dashed outlined square) to the momentary size (hatched square). Also, no complications in the formation of contacts to the different poly levels of nMOS and pMOS devices are expected.

During etching, contact holes in the premetal dielectric (PMD) covering the substrate 1, the contacts to source and drain areas and to nMOS and pMOS gates are etched at the same time and all these surface are located at different levels.

Figure 5A:
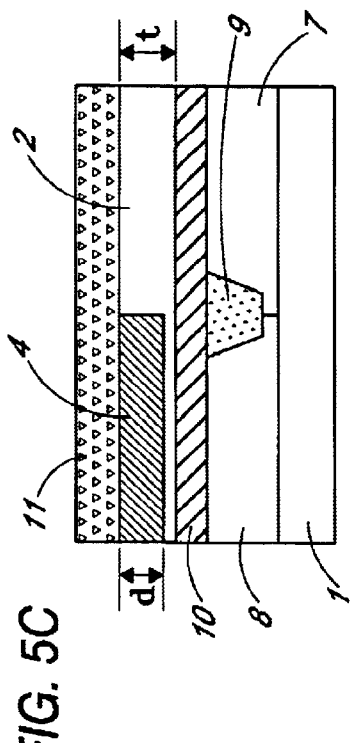
FIG. 5A is an exemplary cross sectional illustration of a semiconductor device at an intermediary stage of forming nMOS and pMOS devices with different gate electrode thickness according to one embodiment of a method of manufacturing a semiconductor device.

One embodiment of a method of forming a dual-thickness gate electrode in a submicron CMOS process is illustrated in FIGS. 5A–E. A wafer, such as an 8-inch silicon wafer 1, comprising n-type and p-type active area's 7, 8 and field regions 9, is processed. A 5 nm thick silicon dioxide gate dielectric layer 10 is thermally grown on the wafer 1. A 150 nm layer of polycrystalline silicon 2 is deposited on the gate dielectric layer 10 using a chemical vapor deposition (CVD) process (FIG. 5A). This polysilicon layer 2 serves as a gate electrode layer.

Figure 5B:
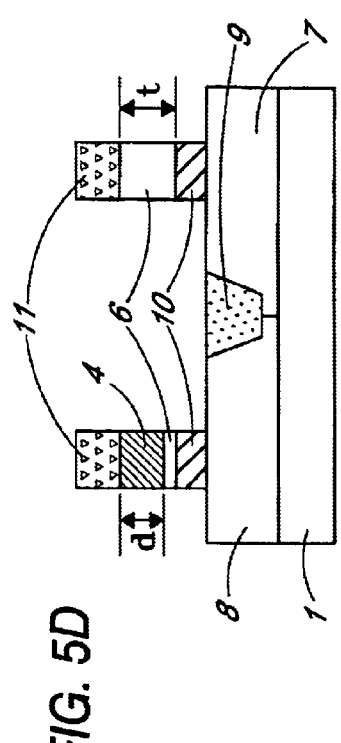
FIG. 5B is an exemplary cross sectional illustration of a semiconductor device at an intermediary stage, following the stage illustrated in FIG. 5A, of forming nMOS and pMOS devices with different gate electrode thickness according to one embodiment of a method of manufacturing a semiconductor device.
Figure 5C:
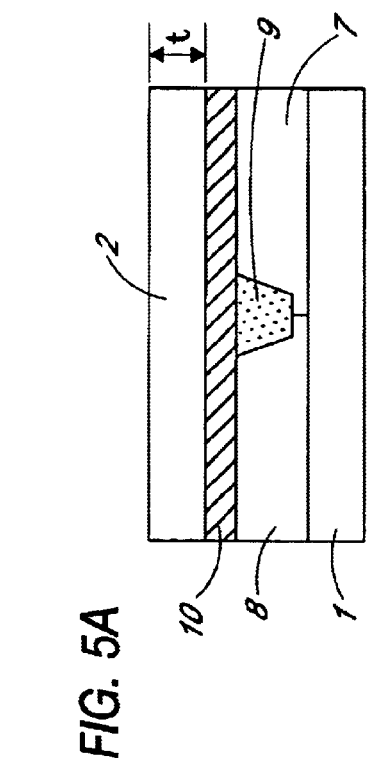
FIG. 5C is an exemplary cross sectional illustration of a semiconductor device at an intermediary stage, following the stage illustrated in FIG. 5B, of forming nMOS and pMOS devices with different gate electrode thickness according to one embodiment of a method of manufacturing a semiconductor device.

The standard lithographic process for nMOS gate predoping is performed using a pwell mask to select at least one selected region 3. A phosphorus dose of about 3e15/cm2 is implanted with an energy of about 20 keV in the selected region 3 of the gate electrode 2 to form a disposable part 4 with a depth d of about 50 nm, as shown in FIG. 5B. In standard practice of submicron lithographic processes applying 193 nm or 157 nm lithographic technology, an anti-reflective coating (ARC) 11 is established on top of the gate electrode 2, as shown in FIG. 5C. This ARC layer 11 prevents unwanted reflection of the radiation incident at the interface of the resist layer 5 with the underlying gate electrode 2 during the exposure of the resist layer. In the present example, a SiON layer of 50 nm is used as the ARC layer 11, although other materials are known and can be used by persons skilled in the technology.

Figure 5D:
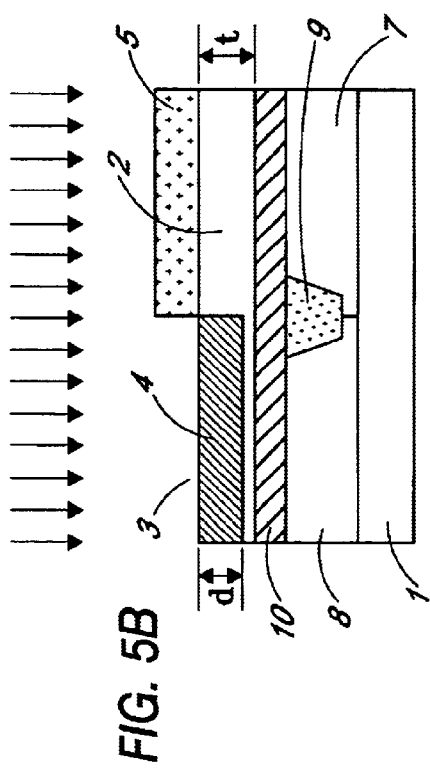
FIG. 5D is an exemplary cross sectional illustration of a semiconductor device at an intermediary stage, following the stage illustrated in FIG. 5C, of forming nMOS and pMOS devices with different gate electrode thickness according to one embodiment of a method of manufacturing a semiconductor device.
Figure 5E:
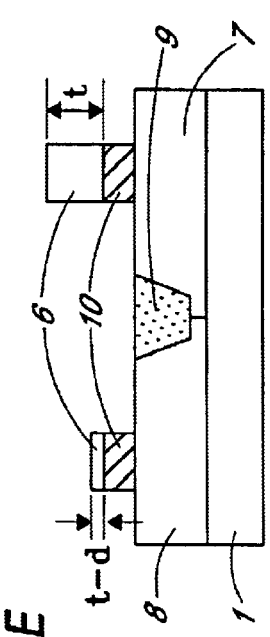
FIG. 5E is an exemplary cross sectional illustration of a semiconductor device at an intermediary stage, following the stage illustrated in FIG. 5D, of forming nMOS and pMOS devices with different gate electrode thickness according to one embodiment of a method of manufacturing a semiconductor device.

The gate stack can be patterned as discussed with respect to FIGS. 2A–E, and the stack is shown in FIG. 5D. The photosensitive layer 5 is removed, leaving nMOS gate stacks comprising an ARC layer 11, a disposable part 4, an as-deposited part 6, and the gate dielectric 10, and pMOS gate stacks not having a disposable part 4. The ARC layer 11 can be removed using a standard phosphoric acid wet etching step. During this wet removal of the ARC 11, the higher doped part 4 of the polysilicon layer 2 is attacked. Due to the higher doping, this part of the gate electrode becomes sensitive to the same etching species as was already used for the removal of the ARC layer. Due to the high selectivity of the SiON and highly doped silicon etching with respect to undoped silicon, the removal process is substantially well controlled. The etching process stops once the highly doped silicon part is removed, resulting in dual gate CMOS devices as shown in FIG. 5E. The polysilicon thickness can thus be defined separately for nMOS and pMOS devices by defining the thickness t of the deposited polysilicon layer and doping conditions determining the doping depth d, prior to $H_3PO_4$ etching of both the ARC layer 11 and the higher doped silicon portions.

Additional experiments have been performed according to the method described with respect to FIGS. 5A–E. In a first series of tests, 8-inch p-type silicon wafer substrates were used. A layer of 2 nm Nitrogen Oxide (NO) dielectric was formed on top of the wafers. A 150 nm layer of polycrystalline silicon was deposited on top of the gate dielectric. The gate electrode material was doped using the splits listed in Table 1. After partly doping the polysilicon layer, the wafers were subjected to an annealing process according to the splits in Table 1. The SiON antireflection layer was then deposited and the gate stack was patterned to form the individual transistors, wherein the patterning process comprised lithographic processing, etching and removal of the resist layer. After patterning, the SiON layer remaining on top of the gate stack pattern is removed using phosphoric acid as indicated in Table 1. The wafer is then cleaned after this wet etching step by an HF-based cleaning solution.

TABLE 1

Overview of process splits

| | splits/wafernumber | | | | | | | | | | | | |
|---|---|---|---|---|---|---|---|---|---|---|---|---|---|
| | 3 | 4 | 5 | 6 | 7 | 8 | 9 | 10 | 11 | 12 | 13 | 14 | 15 |
| Gate predoping | | | | | | | | | | | | | |
| As, 3e15, 40 keV | x | | | | | | | | | | | | |
| As, 1e15, 40 keV | | x | | | | | | | | | | | |
| B, 3e15, 5 keV | | | x | | | | | | | | | | |
| BF2, 3e15, 6 keV | | | | x | | | | | | | | | |
| P, 3e15, 20 keV | | | | | x | | | x | x | x | x | x | x |
| P, 5e14, 20 keV | | | | | | x | | | | | | | |
| P, 1e14, 20 keV | | | | | | | x | | | | | | |
| Annealing | | | | | | | | | | | | | |
| 600° C., 1 min | | | | | | | | x | | | | | |
| 750° C., 1 min | | | | | | | | | x | | | | |
| 800° C., 1 min | | | | | | | | | | x | | | |
| 850° C., 1 min | | | | | | | | | | | x | | |
| 900° C., 1 min | | | | | | | | | | | | x | |
| 950° C., 30s | | | | | | | | | | | | | x |
| SiON removal 10 min | x | x | x | x | x | x | x | x | x | x | X | x | x |
| H3PO4 followed by HF-based clean | | | | | | | | | | | | | |

In a second series of experiments 8-inch p-type silicon substrates were used. In these experiments, a gate dielectric of 1.5 nm NO was grown on the substrates. This thinner gate dielectric was used in order to investigate the selectivity of the wet etchant used to remove the doped part of the gate electrode as applied to the gate dielectric and the underlying substrate. A 150 nm layer of polycrystalline silicon was also grown for use as a gate electrode layer. For some wafers, a CVD oxide layer, e.g. TEOS, was formed on top of the uniform polycrystalline silicon layer as indicated in Table 2. This oxide layer influences the implantation process as it forms an additional barrier to the incoming ions. The gate electrode layer is then doped with Phosphorus with an energy ranging from 20 keV to 35 keV and an implant dose ranging from 3e15 cm$^{-2}$ to 1e15 cm$^{-2}$, according to the splits listed in Table 2.

After the doping of the gate electrode layer, whether or not an additional layer is used as stopping layer or implant barrier, some wafers were annealed according to different annealing conditions. The TEOS layer was then removed by e.g. wet etchant such as an HF solution, leaving the polysilicon layer substantially intact. The antireflective SiON layer was then deposited, followed by the patterning of the gate stacks. The protective resist layer on top of the gate stack was then removed, and the SiON layer was removed by one of the two wet etchants, according to the splits listed in Table 2. The removal of the sacrificial elements 4 is preferably performed using a phosphoric solution in water with a concentration of between about 83 to 87% by weight of phosphoric acid. The operative temperature of the etching process can be between about 150° to 160° Celsius and preferably about 159° Celsius. The removal of the sacrificial elements 4 can also be done using a mixture of about 95% sulfuric acid, 85% phosphoric acid and water in a ratio of 1/10/2 at an operative temperature of about 140° Celsius.

TABLE 2

Overview of process splits in a second experiment

| | | 3 | 4 | 5 | 6 | 7 | 8 | 9 | 10 | 11 | 12 | 13 |
|---|---|---|---|---|---|---|---|---|---|---|---|---|
| A. | Splits/wafernumber | | | | | | | | | | | |
| B. | 10 nm TEOS deposition | | x | x | | | | | x | X | | |
| | II. GATE PREDOPING (species, dose, energy) | | | | | | | | | | | |
| | No doping | x | | | | | | | | | | |
| | P, 3e15, 20 keV | | x | x | x | x | x | x | | | | |
| | P, 1e15, 35 keV | | | | | | | | x | X | x | x |
| A. | Annealing (temperature, time) 950° C., 30s | | | | | | x | x | | | | |
| B. | SiON removal 10 min (etchant) | | | | | | | | | | | |
| | H3PO4 followed by HF-based clean | x | x | | x | | x | | x | | x | |
| | Mixture of H3PO4 and H2PO4 in water | | | x | | x | | x | | X | | x |

Figure 6A:
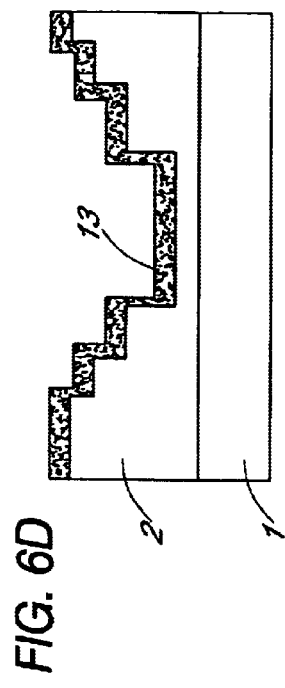
FIG. 6A is an exemplary cross sectional illustration of a semiconductor device at an intermediary stage of forming an MEMS device according to one embodiment of a method of manufacturing a semiconductor device.

Another embodiment of the invention comprises a method of forming Micro-electromechanical systems (MEMS) devices, as illustrated in FIGS. 6A–E. In FIG. 6A, a substrate 1 of a MEMS device is shown, comprising a device layer 2 deposited on the substrate 1. The substrate 1 can be, for example, a ceramic substrate, glass or a semiconductor substrate. The device or permanent layer 2 is partitioned in a disposable part 4 having predefined dimensions and a non-disposable part 12. The partitioning is achieved using the methods disclosed in the previous embodiments (FIG.

Figure 6B:
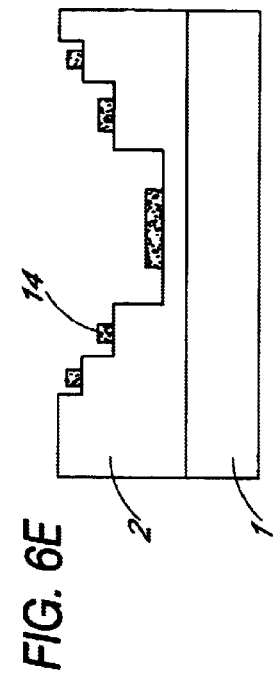
FIG. 6B is an exemplary cross sectional illustration of a semiconductor device at an intermediary stage, following the stage illustrated in FIG. 6A, of forming an MEMS device according to one embodiment of a method of manufacturing a semiconductor device.
Figure 6C:
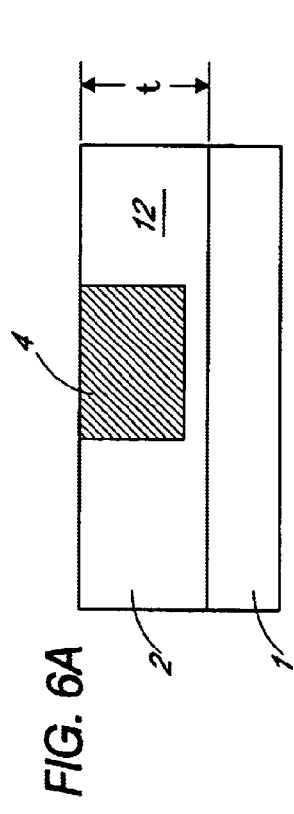
FIG. 6C is an exemplary cross sectional illustration of a semiconductor device at an intermediary stage, following the stage illustrated in FIG. 6B, of forming an MEMS device according to one embodiment of a method of manufacturing a semiconductor device.
Figure 6D:
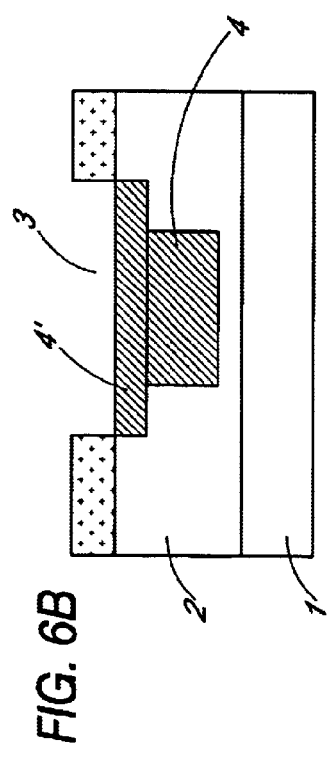
FIG. 6D is an exemplary cross sectional illustration of a semiconductor device at an intermediary stage, following the stage illustrated in FIG. 6C, of forming an MEMS device according to one embodiment of a method of manufacturing a semiconductor device.
Figure 6E:
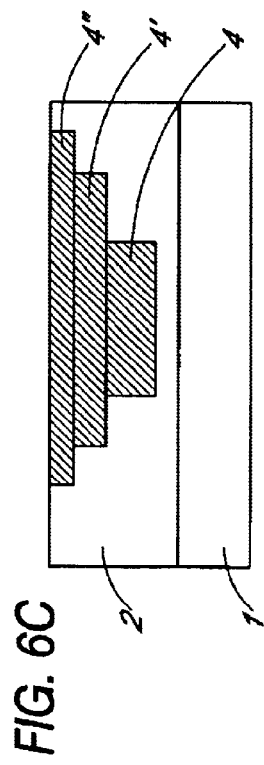
FIG. 6E is an exemplary cross sectional illustration of a semiconductor device at an intermediary stage, following the stage illustrated in FIG. 6D, of forming an MEMS device according to one embodiment of a method of manufacturing a semiconductor device.

5B). Aligned to this first disposable element 4, new regions 3 can be selected and other disposable parts 4' are created as shown in FIG. 6B. In FIG. 6C, a device layer 2 is shown comprising a substantially pyramidal shaped disposable part comprising three partially overlapping disposable parts 4, 4', 4". After removal of this pyramidal shaped disposable part, a cavity is created in the device layer as shown in FIG. 6D. In this embodiment, the cavity is covered with a metal layer 13 yielding a concave shaped mirror. This metal layer 13 could also be patterned afterwards yielding e.g. a metal pattern 14 to be used as a contact, at each depth or level within the device layer 2, as defined by the depth of the corresponding disposable parts 4, 4', 4".

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of forming a structure in a device layer of an electronic component, the method comprising:
    forming a device layer on a substrate;
    forming at least one disposable part in a selected region of the device layer, wherein the disposable part comprises a material that is substantially the same as the device layer and within the thickness of the device layer;
    patterning the device layer in the selected region; and
    selectively removing the at least one disposable part from the device layer.

2. The method of claim 1, wherein forming at least one disposable part in the selected region of the device layer comprises altering the removal properties of the device layer to a predefined depth within the device layer.

3. The method of claim 2, wherein changing the removal properties of the device layer comprises doping the selected region of the device layer to a predefined depth.

4. The method of claim 3, wherein doping the selected region of the device layer comprises ion implantation.

5. The method of claim 1, wherein the substrate comprises a semiconductor substrate.

6. The method of claim 1, wherein the device layer comprises a gate electrode layer.

7. The method of claim 6, wherein the device layer comprises a semiconductor material.

8. The method of claim 7, wherein the semiconductor material comprises silicon.

9. The method of claim 1, further comprising establishing an antireflective layer on the device layer prior to patterning the device layer.

10. The method of claim 9, wherein the antireflective layer comprises at least one of Si, O and N.

11. The method of claim 9, wherein selectively removing the at least one disposable part of the device layer further comprises removing the patterned antireflective layer.

12. An integrated circuit, comprising a device layer having at least a first and second region, wherein the first region has a different thickness than that of the second region, wherein the difference in thickness between the first and second regions is produced from formation of a disposable part in the device layer and removal of the disposable part to form the first and second regions after the device has been patterned.

13. The integrated circuit of claim 12, wherein the device layer is a gate electrode layer.

14. The integrated circuit of claim 13, wherein the device layer comprises a semiconductor material.

15. The integrated circuit of claim 14, wherein the semiconductor material comprises silicon.

16. A partially completed integrated circuit, comprising a device layer having at least a first and second region, wherein, at least within a thickness of the first region, a disposable portion is formed such that the disposable portion is removable so as to change the thickness of the first region such that the first region has a different thickness than the second region.

17. An apparatus configured to form topography in a device layer of an electronic component or a device made using semiconductor processing techniques, the apparatus comprising:
    means for forming a device layer on a substrate;
    means for forming at least one disposable part in a selected region of the device layer, wherein the disposable part is formed from the same material as the device layer and within the thickness of the device layer;
    means for patterning the device layer in the selected region; and
    means for selectively removing the at least one disposable part from the device layer.

18. A method of manufacturing a semiconductor device having a device layer with a varying thickness, comprising:
    outlining at least one selected region of the device layer;
    forming at least one disposable part in the at least one selected region of the device layer, wherein the disposable part is formed to a predefined depth of the device layer;
    patterning the device layer in at least the selected region; and
    selectively removing the disposable part from the device layer.

19. The method of claim 18, wherein outlining at least one selected region of the device layer and forming at least one disposable part in the at least one selected region is repeated a plurality of times so as to form disposable parts having different thicknesses in different selected regions of the device layer.

20. The method of claim 18, wherein forming a disposable part in the at least one selected region comprises altering the removal properties of the device layer in the selected region up to a predefined depth of the device layer.

21. The method of claim 20, wherein altering the removal properties comprises doping the selected region of the device layer to a predefined depth.

22. The method of claim 18, wherein the device layer comprises a gate electrode layer.

* * * * *